United States Patent
Wang et al.

(10) Patent No.: US 8,342,055 B2
(45) Date of Patent: Jan. 1, 2013

(54) TOGGLE-TYPE POSITIONING PLATFORM

(75) Inventors: Shih-Ming Wang, Chung-Li (TW); Yu-Ding Chen, Chung-Li (TW)

(73) Assignee: Chung Yuan Christian University, Chung-Li (TW)

( * ) Notice: Subject to any disclaimer, the term of this patent is extended or adjusted under 35 U.S.C. 154(b) by 0 days.

(21) Appl. No.: 13/093,101

(22) Filed: Apr. 25, 2011

(65) Prior Publication Data

US 2011/0259139 A1    Oct. 27, 2011

(30) Foreign Application Priority Data

Apr. 23, 2010    (TW) .............................. 99112763 A (51) Int. Cl.
*F16H 55/18*    (2006.01)
(52) U.S. Cl. ....... 74/490.09; 74/89.23; 108/20; 108/143
(58) Field of Classification Search .............. 108/20–22, 108/51.11, 59, 60, 61, 80, 81, 140, 138, 143; 269/60; 74/89.23, 89.32, 89.33, 490.09, 74/490.07, 490.03; *G05G 11/00; F16H 21/16*
See application file for complete search history.

(56) References Cited

U.S. PATENT DOCUMENTS

| | | | | |
|---|---|---|---|---|
| 4,896,869 A * | 1/1990 | Takekoshi | ........................ | 269/60 |
| 4,972,574 A * | 11/1990 | Isono et al. | ..................... | 29/740 |
| 5,279,178 A * | 1/1994 | Yanagisawa | ............... | 74/490.09 |
| 5,440,943 A * | 8/1995 | Holt et al. | ..................... | 74/89.23 |
| 5,477,743 A * | 12/1995 | Yanagisawa | ............... | 74/490.09 |
| 5,481,936 A * | 1/1996 | Yanagisawa | ............... | 74/490.08 |
| 5,724,893 A * | 3/1998 | Lee et al. | ......................... | 108/20 |
| 5,903,125 A * | 5/1999 | Prentice et al. | ............... | 318/625 |
| 6,271,657 B1 * | 8/2001 | Nemoto | .................... | 324/750.25 |
| 6,328,510 B1 * | 12/2001 | Hanrath et al. | ............... | 409/235 |
| 6,347,458 B1 * | 2/2002 | Kaczynski | ..................... | 33/503 |
| 7,100,515 B2 * | 9/2006 | Helm et al. | ..................... | 108/20 |
| 7,306,423 B2 * | 12/2007 | Ogawa et al. | ............... | 414/749.1 |
| 7,930,952 B2 * | 4/2011 | Wang et al. | ................ | 74/490.09 |
| 8,272,334 B2 * | 9/2012 | Wang et al. | ..................... | 108/20 |
| 2007/0295138 A1 * | 12/2007 | Wang et al. | ................ | 74/490.07 |
| 2012/0006140 A1 * | 1/2012 | Wang et al. | ................ | 74/490.07 |

* cited by examiner

*Primary Examiner* — Troy Chambers
*Assistant Examiner* — Valentin Craciun
(74) *Attorney, Agent, or Firm* — WPAT PC; Justin King (57) ABSTRACT

This invention provides a precise positioning platform by using of toggle type principle, wherein the positioning platform can be single toggle type, double toggle type, or combination with multi-link to enhance positioning platform precision.

10 Claims, 7 Drawing Sheets

TOGGLE-TYPE POSITIONING PLATFORM

FIELD OF THE INVENTION

The present invention relates to a positioning platform and machine, and more particularly to a toggle-type positioning platform and machine.

BACKGROUND OF THE INVENTION

With the development in industry and the advancement in technology, every industrial product now progresses toward micro and concise. Hence, a new developed topic on micro/meso-scale manufacturing technology will be critical to manufacturing technology. The micro/meso-scale drilling technology can be applied to national defense, aerial transportations, electronic devices, optical devices, communication, and bio-medical industry, particularly to high speed communication micro optical devices, micro-actuator and micro-sensor on vehicle and medical tools, micro-nozzle on high temperature jet engine, micro fuel cell, micro hole on fiber, and photolithography.

In industrial applications, precise machining is based on high precision positioning technology. Therefore, how to enhance precise positioning is an important index in promotion of industry. The difficulties of the precise positioning technology resulted from too many uncertain factors. Generally, the factors, which are not concerned in large-scale positioning, should be concerned in micro/nano scale positioning.

The wet etching, plasma etching, LIGA process, electron beam, ion beams and so on are used in nano-scaled machining, thus resulting in the development of micro-electro mechanical system (MEMS). Generally speaking, MEMS technology is applied in the fabrication of about 2D to 2.5D geometry, and the relative precision of fabrication is limited to about $10^{-1}$ to $10^{-2}$ millimeter. However, for many 3-D miniaturized products having requirements of higher precision and complex shape, the MEMS technology is not able to meet the requirements. Besides, another bottleneck of the MEMS technology is that it can not be applied to metallic material or other diversified materials. Furthermore, scanning tunneling microscope (STM) or atomic force microscope need to be used in nano-scaled fabrication, but the operation speed is lower and the technique is not mature yet.

Currently, machine tools of multi-axles are serial connected mechanism. This serial connected mechanism, which is similar to cantilever beams, has a larger working area, but it may deform or have displacement due to external loading or its weight. Therefore, only the conventional servo system of serial connected mechanism of higher precision may achieve the precision of sub-micron or even nano-meter scaled. However, the requirements of the related control technique are very strict, and the cost of the whole equipment is effectively increased. Besides, machines features the piezoelectric actuators also have the problems of smaller stroke and hysteresis.

Therefore, this invention provides a toggle type positioning platform to achieve high precision.

SUMMARY OF THE INVENTION

The present invention is directed to a three-link toggle type positioning platform, which comprises a base, a ballscrew disposed on the base, a rotation means disposed on the base, a link on the base, a linear restriction element on the base, and a working platform on the base, wherein the working platform is coupled to a second end of the link. The rotation means rotates the ballscrew. A first end of the link is coupled to the ballscrew, and the first end of the link moves back and forth along direction of the linear restriction element with the rotation of the ballscrew. The linear restriction element restricts the second end of the link moves back and forth along direction of the linear restriction element.

This invention also provides a double toggle type positioning platform, which comprises a base, a ballscrew disposed on the first platform, means for rotating the ballscrew on the base, a first link on said base, a first end of said first link coupled to said ballscrew and moving back and forth along a direction of said first link with rotation of said ballscrew, a first linear restriction element disposed on the base, for restricting a portion away from the first point of said first link moving back and forth along a direction of the first linear restriction element, a second link on said base, a first end of said second link coupled to a second end of said first link, a platform on said base and coupled to a second end of said second link, and a second linear restriction element for restricting said platform moving back and forth along a direction of said second linear restriction element.

DESCRIPTION OF THE EXEMPLARY EMBODIMENTS

The present invention provides a toggle type positioning platform. For complete understanding of the present invention, the following description will describe in detail the method steps and the components. The present invention is not limited by the specified particulars of the machining art that are familiar to persons skilled in the art. In addition, well-known components or method steps are not described in detail so as to avoid any additional limitation. The preferable embodiments of the present invention are described in detail. In addition to the detailed descriptions, the present invention also can be applied to other embodiments. Therefore, the scope of the present invention is not limited, and is dependent on the following claims.

Figure 1:
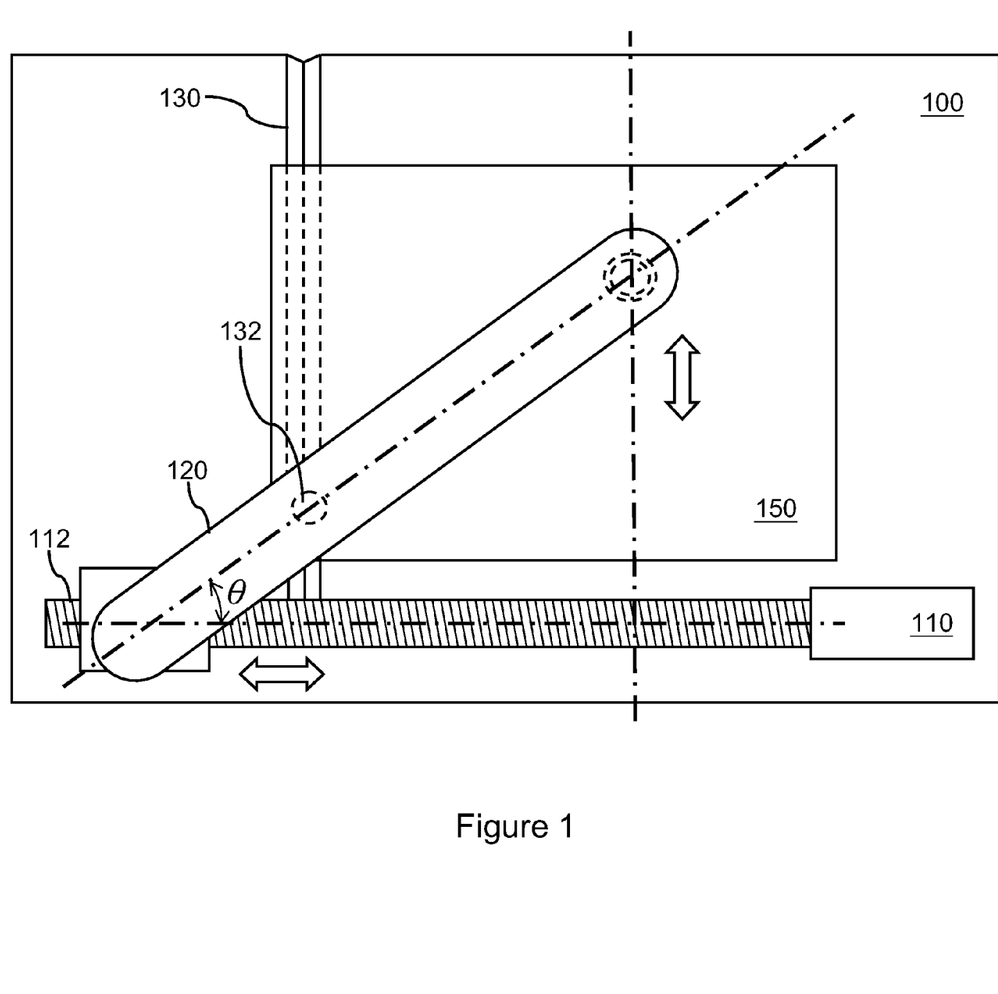
FIG. 1 is a schematic diagram of a top view for illustrating single toggle type positioning platform according to an embodiment of the present invention.

FIG. 1 is a schematic diagram of a top view for illustrating single toggle type positioning platform according to an embodiment of the present invention. In this embodiment, the single toggle type positioning platform includes a base 100, a rotation device 110, a screw or a ballscrew 112, a working platform 150, and a link 120, wherein the rotation device 110, screw 112 and working platform are disposed on the base 100. The rotation device 110 is a motor 100, coupled to the screw 112 and rotates the screw 112. The working platform 150 will move back and forth along a pre-determined direction on the base 100, and the pre-determined direction will includes an angle with the screw 112. In one embodiment, this angle can be orthogonal or other angles. The link 120, between the working platform 150 and the base 100, connects between the working platform 150 and the screw 112. Rotation of the screw 112 will move one end of the link 120 back and forth along direction of the screw 112 and push working platform 150 back and forth along the pre-determined direction.

More detail, the base 100 may have a linear restriction element 130, and can be a trench structure in one embodiment, and the working platform 150 will move along the trench. In this embodiment, the trench can be a V, or U shape, or any other shape. Further, the base may include a ball bearing 132 disposed on the base 100 and between the base 100 and the working platform 150, and push the working platform 150 moving along the pre-determined direction. In one embodiment, the ball bearing 132 can move along the trench 130. Further, the linear restriction element 130 can be other structure, for example sliding rail.

Furthermore, ball bearing 130 can be disposed between the base 100 and the link 120, to push the working platform 150 moving along the predetermined direction. Meanwhile, the working platform 150 can includes another linear restriction element to increase stability of the working platform 150.

The single toggle type positioning platform will have some advantages as described below. First, the toggle type positioning platform can increase precision and resolution. Moreover, this toggle type positioning platform can achieve high precision and resolution without using sophisticated servo system.

The single toggle type positioning platform can be applied to micro machine or micro tool. The most important advantage is that resolution of the working platform can be increased by using a trigonometric function ratio between screw servo and working platform. However, in such a ratio, working platform with high resolution will have small portion in whole motion, and in whole motion the resolution may vary ten times. In order to improve variant resolution of single toggle type positioning platform, this invention also provides a double toggle type positioning platform.

Figure 2:
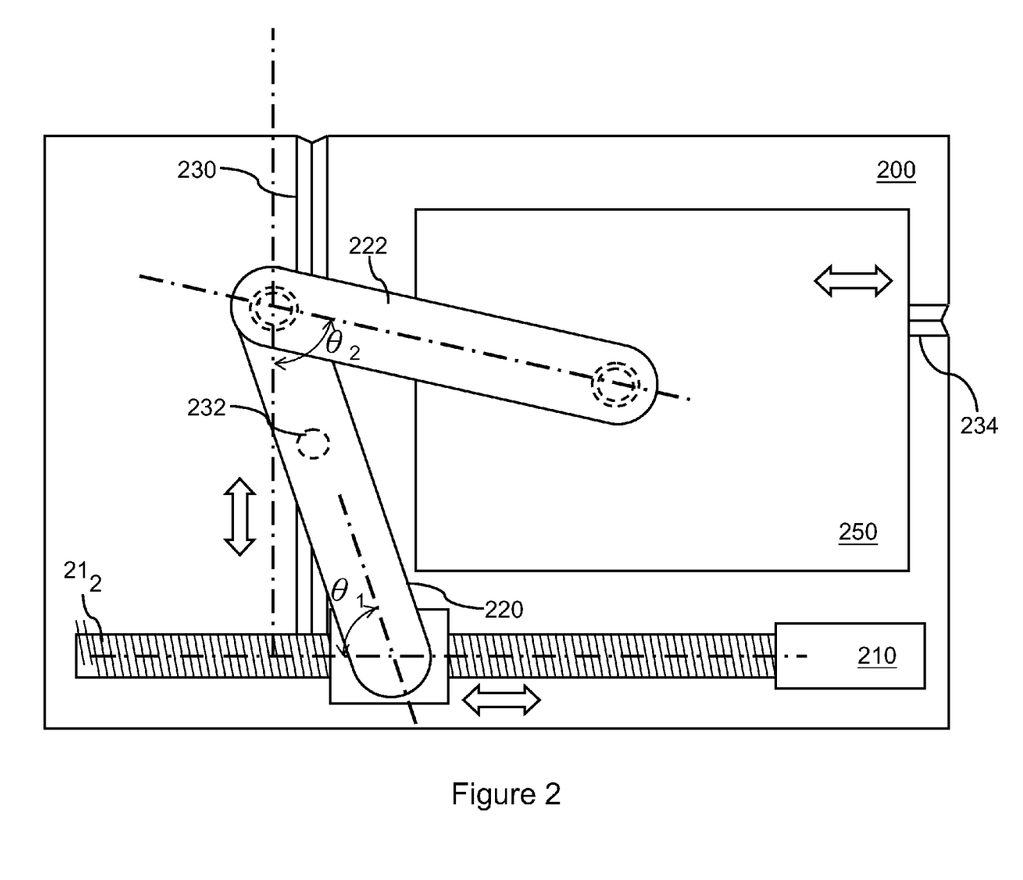
FIG. 2 is a schematic diagram of a top view for illustrating double toggle type positioning platform according to an embodiment of the present invention.

FIG. 2 is a schematic diagram of a top view for illustrating double toggle type positioning platform according to an embodiment of the present invention. In the embodiment, the double toggle type positioning platform comprises a base 200, a rotation device 210, a screw 212, a first link 220, a second link 222, a first linear restriction element 230, a second linear restriction element 234, and a working platform 250. The rotation device 210, is a motor in this embodiment, disposed on the base 200, and rotates the screw 212. When the screw 212 rotates, it will push a first end of the first link 220 moving back and forth along direction of the screw 212. The first linear restriction element 230, can be a trench structure, a portion or the other end of the first link 220 can move along a direction of the first linear restriction element 230. In this embodiment, the trench structure can be V, U shape or other shapes. Further, the base 200 can include a ball bearing 232, wherein the ball bearing 230 is disposed on the base 200, between the first link 220 and the base 200, and therefore pushes a portion of the first link 220 moving along a pre-determined direction, wherein this pre-determined direction will include and angle with the screw 212. In one embodiment, this angle can be orthogonal. In one embodiment, the ball bearing 232 can move along the trench 230.

A first end of the second link 222 is coupled to the second end of the first link 220, and a second end of the second link 222 coupled to the working platform 250. The working platform 250, restricted by the second linear restriction element 234, can only move a pre-determined direction back and forth defined by the second linear restriction element 234. The direction defined by the second linear restriction element 234 can be orthogonal to the direction of the first linear restriction element 23, and parallel to the direction of the screw 212. A virtue can be obtained is that moving direction of the first link 220 by the screw 212 is the same with the moving direction of the working platform 250. when the first end of the first link 220 moves along the direction of the screw 212 back and forth by rotation of the screw 212, a portion or the second end of the first link 220, restricted by the first linear restriction element 230, moves back and forth along the direction defined by the first linear restriction element 230. Meanwhile, the second end of the second link 222 is coupled to the working platform 250 and the working plat form 250, restricted by the second linear restriction element 234, moves back and forth along the direction defined by the second linear restriction element 234.

The second linear restriction element 234 can have similar structure to the first linear restriction element 230, such as V, or U shape trench. Further, the second linear restriction element 234 may include a ball bearing (not shown in the Figure), which may have similar operation of the ball bearing 232. Moreover, the second linear restriction element 234, in this embodiment, may include one or more than one trench structure, or other mechanism such as sliding rail, to increase stability of the working platform 250.

The difference between the single double toggle type positioning platform lies only one angle θ between the link 120 and the screw 112 in the single toggle type positioning platform, to increase resolution of the working platform 150, as shown in Figure. However, there are two angles, $\theta_1$ between the first link 220 and the screw 212, and $\theta_2$ between the first linear restriction element 230 and the second link 222, are used to increase working resolution of the working platform 250. The relationship between the first angle $\theta_1$ and the second angle $\theta_2$ in the double toggle type positioning platform is that the smaller the angle of $\theta_1$ is, the lager the angle of $\theta_2$ is, and vice versa. This relationship will affect resolution of whole motion to a similar symmetric relationship or complementary in proportion. When the screw servo moves in a constant speed, variations of the two toggle angles are not the same. Although there may be a complementary relationship, however, there is no perfect symmetric relationship between the two toggle angles. In one embodiment, the two toggle angles are restricted between initial angle of 85 degree and stop angle of 50 degree.

For example, a screw servo with a 4 mm pitch of a screw and 16384 resolution of a motor, this conventional serial moving mechanism will have a relationship as equation (1)

$$\text{resolution of platform}(D) = \frac{\text{pitch of screw}}{\text{resolution of motor}} = \frac{4}{16384} \cong 244 (nm) \quad (1)$$

Figure 3:
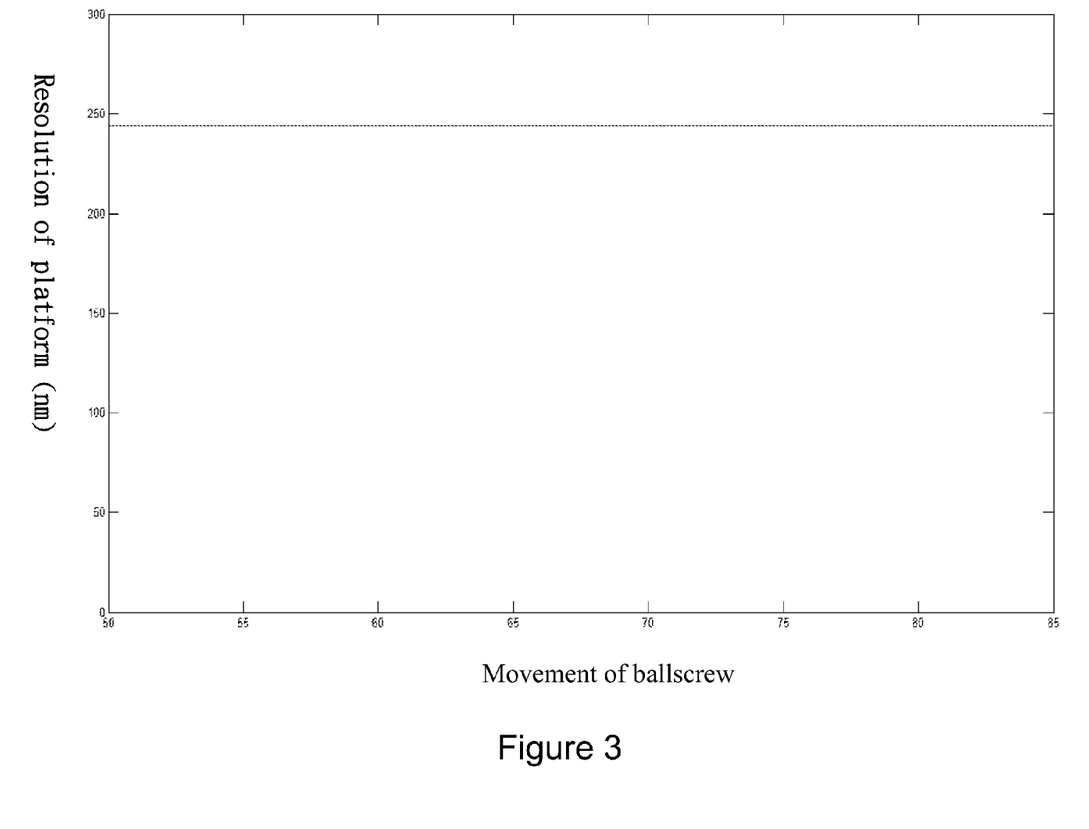
FIG. 3 illustrates a relation curve of resolution of a conventional serial machine.

And the result is shown in FIG. 3.

Resolution of single toggle type positioning platform will have a relationship as equation (2), wherein the angle θ is toggle angle, $$\text{resolution of platform}(D) = \frac{\text{pitch of screw}}{\text{resolution of motor} \times \tan(\theta)} \cong \frac{244}{\tan\theta}(nm) \quad (2)$$

Figure 4:
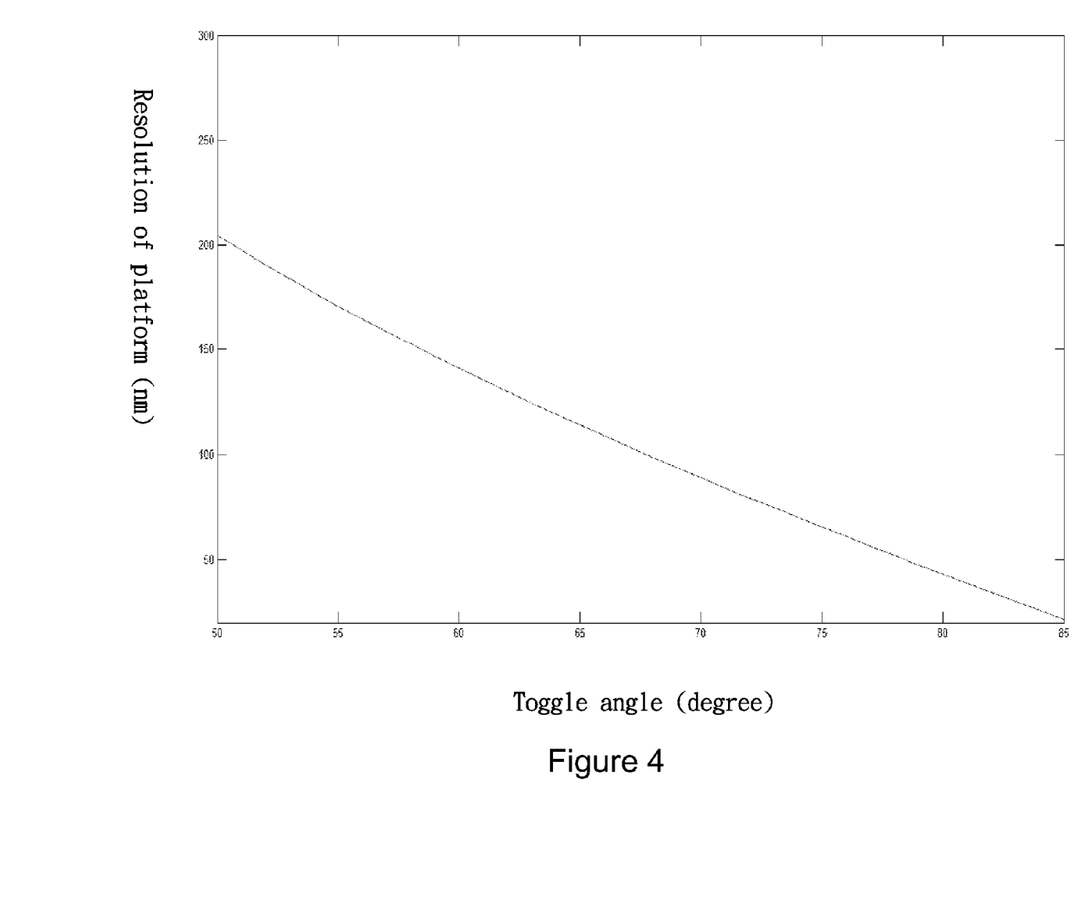
FIG. 4 illustrates a relation curve of resolution of single toggle type machine.

The result is shown in FIG. 4.

Resolution of the double toggle type positioning platform will have a relationship as equation (3), wherein the angle $\theta_1$ is the first toggle angle, and the angle $\theta_2$ is the second toggle angle, $$\text{resolution of } platformD) = \frac{\text{pitch of screw}}{\text{solution of motor} \times \tan\theta_1 \times \tan\theta_2} \cong \frac{244}{\tan\theta_1 \tan\theta_2} (\text{nm}) \quad (3)$$

The equation (3) is a simplified resolution equation, wherein the two toggle angles are presumed to be symmetric, because this difference is so small that can be neglected in practice.

Figure 5:
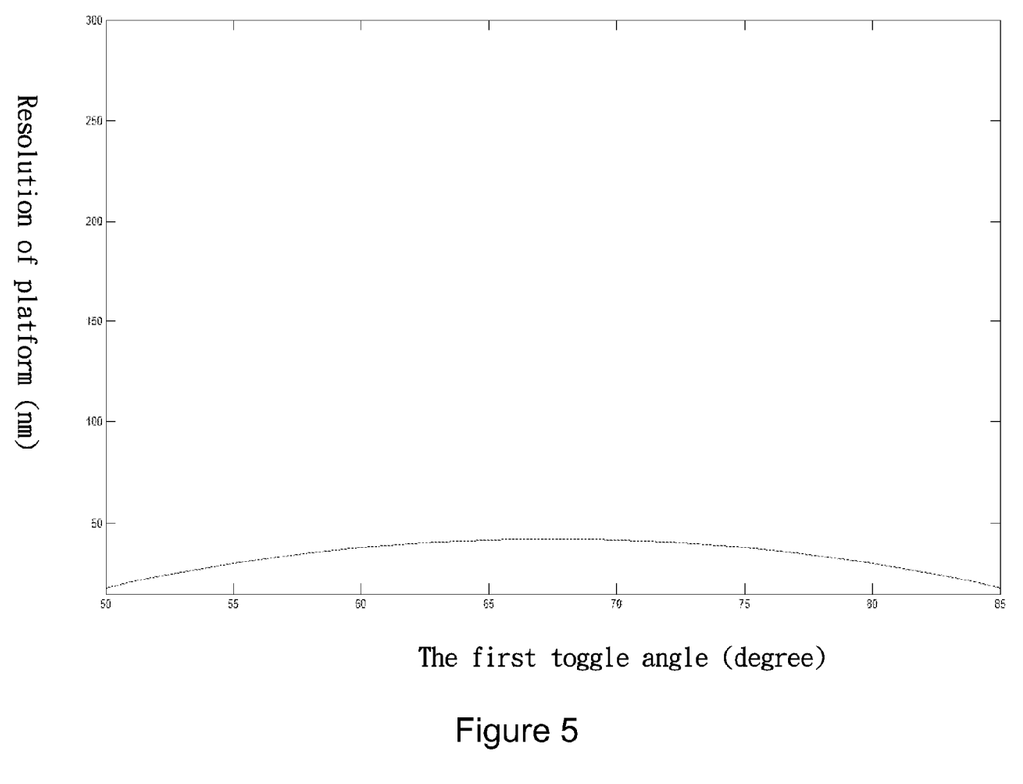
FIG. 5 illustrates a relation curve of resolution of double toggle type machine.

The result can be shown in FIG. 5.

The double toggle type positioning platform can decrease the largest resolution and the least resolution within three times by the complementary relationship, and the averaged resolution is 2.5 times than the single toggle type positioning platform. For example, a 4 mm pitch of screw with 13684 resolution of motor, the double toggle type positioning platform at least has 50 nm moving resolution. Hence, it can improve drawback of large variant resolution of single toggle type positioning platform, and high moving resolution can be obtained without any ultra high precision linear module or high resolution motor. Therefore, it can be applied to micro tool industry very well.

Figure 6:
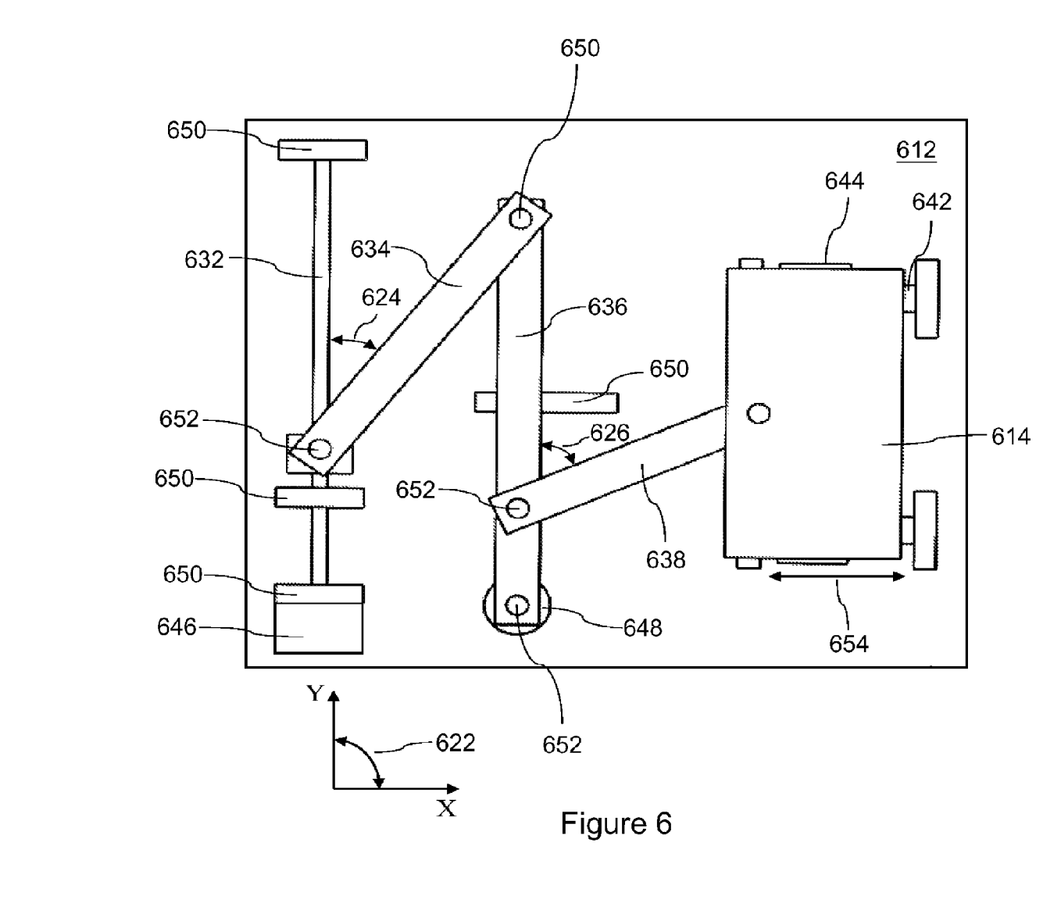
FIG. 6 is a schematic diagram of a top view for illustrating three-link toggle type positioning platform according to an embodiment of the present invention.

FIG. 6 is a top view showing a three-link toggle type positioning platform of the present invention. According to one embodiment, the present invention discloses a three-link toggle type positioning platform which comprises a base 612. A motor 646 is disposed on the base 612. a ballscrew 632, disposed on the base 612*m* is coupled to the motor 646, and the motor 646 is used to rotate the ballscrew 632. a working platform 614 is disposed on the base 612 and moves back and forth along a pre-determined direction 654, wherein the predetermined direction 654 will include a first angle 622 with the ballscrew 632. a second link 636, fastened to a base 648 and parallel to the ballscrew 632 and the working platform 614. A first link 634, disposed between the ballscrew 632 and the second link 636, includes a second angle 624, and connects between the ballscrew 632 and the second link 636. further, a third link 638 disposed between the second link 636 and the working platform 614, includes a third angle 626 and connects between the second link 636 and the working platform 614, wherein rotation of the ballscrew 632 is suitable to move the links to push the working platform 614 moves along the pre-determined direction 654.

The aforesaid working platform 614 can move back and fourth along the first predetermined path 654 with the help of the linear bearing 644 and the slide rail 642. The first linear bearing 644 in the present invention penetrates through the slide rail 642, wherein two opposite ends of the slide rail 642 are fastened on respective supporting frames 650. The length of the slide rail 642 is equal to that of the predetermined path 654. The moving direction of the linear bearing 644 and the slide rail 642 is perpendicular or orthogonal to the ballscrew 632. Furthermore, the linear bearing 644 and the slide rail 642 are disposed between the base 612 and the working platform 614 and fixed on two opposite sides of the working platform 614. Due to the linear bearing 644 is a long-shaped cylindrical tube, which is made of iron or other material, the working platform 614 can not being fixed on it. In the present embodiment, the linear bearing 644 is fixed in a stable long-shaped quadrate tube in order to form a flat surface which disposed between the working platform 614 and the base 612 to avoid rotation. The working platform 614 may have a guide groove and the base 612 is suitable for moving along the guide groove. The guide groove has a cross-section of V-shape, U-shape, or other shapes. Besides, the present embodiment further comprises a ball bearing. The ball bearing is disposed on the working platform 614 and is between the working platform 614 and the base 612, and therefore the working platform 614 may move along the predetermined path 654. In brief, the ball bearing may move along the guide groove (not shown).

The connecting structure for three-link linkage is to connect two opposite ends of the first linkage 634 with the first ballscrew 632 and the second linkage 636, and a second angle 624 is existed between the first ballscrew 632 and the first linkage 634. One opposite end of the second linkage 636 is fixed on the first base 648, wherein the first base 648 can support the second linkage 636. One end of the third linkage 638 connects to the second linkage 636 where near the first base 648. Moreover, one opposite end of the third linkage 638 connects the second platform, wherein a third angle 626 is existed between the second linkage 636 and the third linkage 638.

Due to one end of the second linkage 636 is connected to the first base 648 by a ball bearing and a bolt so as to function as a fixed axle, the second linkage 636 can only move left and right. When the ballscrew 632 is driven by the motor 646 to rotate, the first linkage 634, the second linkage 636 and the third linkage 638 are driven simultaneously by the ballscrew 632 and cause the second angle 624 and the third angle 626 changing along with their movement. Since the second linkage 636 is fixed on the base, the third linkage is non-movable. Moreover, in order to connect three linkages with the working platform 614 and the ballscrew 632 on a same horizontal plane, the three linkages have a supporting frame 650 which supports the three linkages having the same height as the working platform 614 and the ballscrew 632. In that way, the suspended three linkages can apply force properly.

Additionally, the second linkage 636 is connected to the first linkage 634 and the third linkage 638. When the ballscrew 632 is driven by the motor 646 to rotate, the three linkages are driven simultaneously by the rotation of the ballscrew 632. The second angle 624 and the third angle 626 would change due to the movements of the three linkages, such that the working platform 614 is driven to move along the predetermined path 654.

In the present invention, the first angle is existed between the extended directions of the working platform 614 and the ballscrew 632, wherein the first angle is about 90°. The second angle is existed between the first linkage 634 and the third linkage 638, wherein the second angle is between about 0° to 90°. Further, the third angle is existed between the second linkage 636 and the third linkage 638, wherein the third angle is between about 0° to 90°.

The ballscrew 632, the first linkage 634, the second linkage 636, the third linkage 638, the working platform 614 and the base 648 are connected by the ball bearing and the bolt in order to decrease frictions therebetween and to decrease the load of the motor 646.

The present invention provides a positioning platform with a toggle-type mechanism to improve its positioning precision. Moreover, the present invention provides a positioning platform with a three-link toggle type mechanism which makes it move faster than a single-link toggle type mechanism.

One embodiment is further disclosed according to above toggle theory. Please refer to FIG. 7, a one-axial toggle-type positioning platform includes a base 702, a motor 704 disposed on the base 702, a ballscrew 710 disposed on the base 702 and coupled to the motor 704 such that the motor 704 can drive the ballscrew rotating, a second platform disposed on the base 702 and moved back and forth along a pre-determined direction 726, wherein the pre-determined direction 726 is anti-parallel to direction of the movement of the ballscrew, and a linear bearing covering the ballscrew 710 and moving with rotation of the ballscrew 710. The toggle-type positioning platform also includes a first link 714 fastened to upper portion of the linear bearing 708 and parallel to the ballscrew 710 and moved with the linear bearing 708, a second link 716, and a third link 718. The second link 716, between the first link 716 and the third link 718, is perpendicular to both first link 714 and third link 718. The third link 718 is between the second link 716 and the working platform 720, wherein rotation of the ballscrew 710 can drive the first link 714, the second link 716, and the third link 718 moving to move the second platform along the pre-determined direction 726. In order to rotate the ballscrew 710 stable, an L-support 112 is provided for supporting the ballscrew 710.

Next, the working platform 720 can move along the pre-determined direction 726 by using two rails 722. Length of the rails 722 can be about length of the pre-determined direction 726. Direction of the rails 722 can be parallel to the ballscrew 710. The rails 722 can be between the base 702 and the working platform 720, and can disposed on two opposite sides of the working platform 720. The base can have a trench (not shown in the FIG. 7) and the working platform 720 can move along the trench, wherein the trench can be V shape, U shape, or other shapes.

Figure 7:
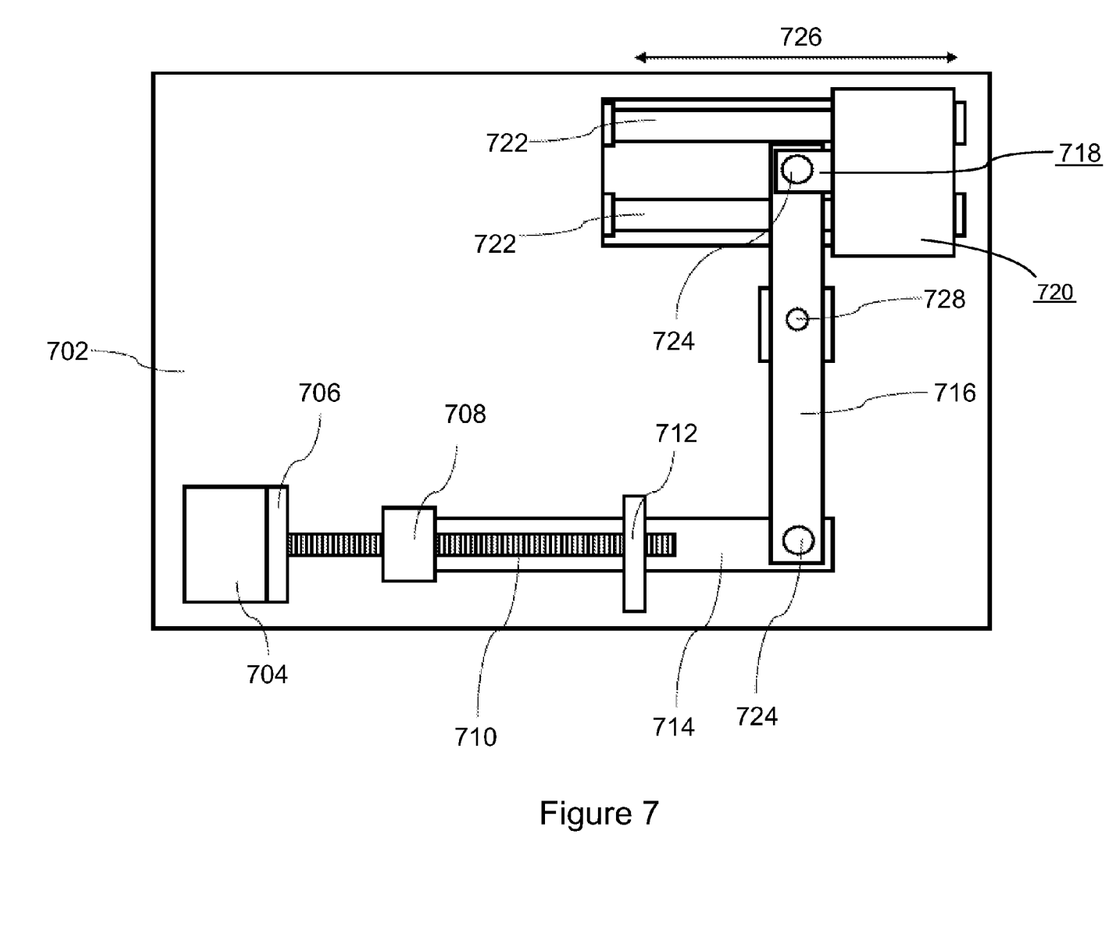
FIG. 7 is a schematic diagram of a top view for illustrating single axial toggle type positioning platform according to an embodiment of the present invention.

Then, the opposite ends of the first link 714 connect to the linear bearing 708 and the second link 716 respectively. The first link 714 and the second link 716 form a right angle. The opposite ends of the second link 716 connect to the first link 714 and the third link 718 respectively. The first link 714 is parallel to the third link 718, and the second link 716 is perpendicular to both the first link 714 and the third link 718. Further, a fixed axis 128 is disposed on the second link 716. The fixed axis 128 can make the opposite two ends of the second link 716 free rotation without movement and therefore can change angles to the first link 714 and the third link 718. The two opposite ends of the third link 718 connect to the second link 716 and the working platform 720. The connections among three links are buckled by bolts and C-hooks, and hence the angles between any two links and be varied. While the ballscrew 710 is rotated by the motor 704, the liner bearing 708 covering on the ballscrew 710 can move back or forth with rotation of the ballscrew 710. Because the first link 714 is fastened to the lower portion of the liner bearing 708, and while the linear bearing 708 moves with the ballscrew 710, angles between each of the three links can be varied. The working platform 720 is then moved along the pre-determined direction 726 by the movement of the three links.

The above described toggle type machine, only provides a one-way motion positioning platform. If only one way motion is necessary for precise positioning, the above described invention can be applied directly. However, two directions X and Y are always needed in industrial application. Hence, any combination of the above described embodiments of the present invention can be provided as a planar positioning platform. For example, two directions on a plan needs to be applied to a positioning platform, single toggle type machine can be applied to a first direction, and double toggle type machine, three-link toggle type machine, or one axial toggle type machine can be applied to the second direction; double toggle type machine can be applied to the first direction, and single toggle type machine, three-links toggle type machine, or one axial toggle type machine can be applied to the second direction; or three-link toggle type machine can be applied to the first direction, and one axial toggle type machine can be applied to the other direction. A simplified method is to integrate the same toggle type machines as a planar positioning platform, such as two single toggle type machines or double toggle type machines. Any person skilled in the art will easy to combine or integrate any two embodiments of any toggle type machine into a planar positioning platform, and there is no necessary to describe such a redundant embodiment.

Furthermore, positioning platform can be applied to latitude, for providing a three dimensional positioning machine. Similarly, such a combination can be any kind of embodiments of this invention and is obvious to any person skilled in the art, and there is no necessary to describe such a redundant embodiment.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A double toggle type positioning platform, comprising:
   a base;
   a screw disposed on said base;
   means for rotating said screw on said base;
   a first link on said base, a first end of said first link coupled to said screw and moving back and forth along a direction of said first link with rotation of said screw, wherein a first angle is between said first link and said screw;
   a first linear restriction element disposed on the base, for restricting a portion away from the first point of said first link moving back and forth along a direction of the first linear restriction element;
   a second link on said base, a first end of said second link coupled to a second end of said first link, wherein a second angle is between said first linear restriction element and said second link;
   a platform on said base and coupled to a second end of said second link, wherein the platform has a resolution, and wherein said first angle and said second angle are for increasing said resolution to at least 50 nm; and
   a second linear restriction element for restricting said platform moving back and forth along a direction of said second linear restriction element.

2. The double toggle type positioning platform according to claim 1, wherein said rotation means is a motor.

3. The double toggle type positioning platform according to claim 2, wherein said first and second linear restriction elements are a trench structure respectively on the base.

4. The double toggle type positioning platform according to claim 3, wherein said first and second linear restriction elements include ball bearing respective.

5. The double toggle type positioning platform according to claim 2, wherein said first and second linear restriction elements are sliding rail respectively.

6. The double toggle type positioning platform according to claim 1, wherein said direction of the first linear restriction element is orthogonal to said screw.

7. The double toggle type positioning platform according to claim 6, wherein said direction of the second linear restriction element is orthogonal to the first linear restriction element.

8. The double toggle type positioning platform according to claim 1, wherein said direction of the second linear restriction element is paralleled to said screw.

9. The double toggle type positioning platform according to claim 1, wherein the smaller said first angle is, the larger said second angle is.

10. The double toggle type positioning platform according to claim 1, wherein the larger said first angle is, the smaller said second angle is.

* * * * *